United States Patent
Ohuchi et al.

(10) Patent No.: US 6,911,722 B2
(45) Date of Patent: Jun. 28, 2005

(54) RESIN-MOLDED SEMICONDUCTOR DEVICE HAVING POSTS WITH BUMPS

(75) Inventors: Shinji Ohuchi, Tokyo (JP); Yasushi Shiraishi, Tokyo (JP); Yasuo Tanaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/843,650

(22) Filed: Apr. 27, 2001

(65) Prior Publication Data

US 2002/0060367 A1 May 23, 2002

(30) Foreign Application Priority Data

Apr. 28, 2000 (JP) ........................................ 2000-128764

(51) Int. Cl.⁷ ..................... H01L 23/04; H01L 23/06
(52) U.S. Cl. ...................................... 257/684; 257/730
(58) Field of Search ................................ 257/678, 684, 257/690, 692, 729, 730, 737, 786, 620, 738, 780, 787, 778; 438/106, 108, 110, 113, 462, 460

(56) References Cited

U.S. PATENT DOCUMENTS

| | | | | |
|---|---|---|---|---|
| 3,825,353 A | * | 7/1974 | Loro | 257/735 |
| 5,952,726 A | * | 9/1999 | Liang | 257/778 |
| 5,989,982 A | * | 11/1999 | Yoshikazu | 438/113 |
| 5,994,783 A | * | 11/1999 | You | 257/712 |
| 6,020,217 A | * | 2/2000 | Kuisl et al. | 438/106 |
| 6,140,710 A | * | 10/2000 | Greenberg | 257/786 |
| 6,191,493 B1 | * | 2/2001 | Yasunaga et al. | 257/773 |
| 6,228,678 B1 | * | 5/2001 | Gilleo et al. | 438/108 |
| 6,228,681 B1 | * | 5/2001 | Gilleo et al. | 438/108 |
| 6,265,776 B1 | * | 7/2001 | Gilleo | 257/738 |
| 6,285,085 B1 | * | 9/2001 | Taguchi | 257/737 |
| 6,323,551 B1 | * | 11/2001 | Anzai | 257/737 |
| 6,351,030 B2 | * | 2/2002 | Havens et al. | 257/690 |
| 6,476,501 B1 | * | 11/2002 | Ohuchi et al. | 257/778 |
| 6,613,694 B2 | * | 9/2003 | Ohuchi et al. | 438/759 |
| 2001/0045637 A1 | * | 11/2001 | Farquhar et al. | 257/687 |

* cited by examiner

Primary Examiner—Evan Pert
(74) Attorney, Agent, or Firm—Rabin & Berdo, P.C.

(57) ABSTRACT

A semiconductor apparatus includes a semiconductor device to be mounted on a circuit board; a plurality of conductive posts electrically connected to the semiconductor device; and a plurality of conductive bumps each provided on an outer end of each of the conductive posts, so that the plurality of conductive bump is soldered onto the circuit board when the semiconductor device is mounted on the circuit board. A distance between a peripheral edge of the semiconductor device and an outer edge of the conductive post is determined to be narrow so that a solderbility or wetting condition of the conductive bumps can be visibly recognized easily.

10 Claims, 23 Drawing Sheets

US 6,911,722 B2

RESIN-MOLDED SEMICONDUCTOR DEVICE HAVING POSTS WITH BUMPS

TECHNICAL FIELD OF THE INVENTION

The present invention relates to a semiconductor apparatus, and more particularly, to a resin-molded semiconductor apparatus and method for fabricating the same.

BACKGROUND OF THE INVENTION

Recent years, in connection with the rapid spread of portable apparatus, semiconductor apparatus mounted therein is required to be thinner, smaller and lighter. In order to fill this demand, a large number of inventions have been made.

In fabrication of a conventional semiconductor apparatus, a rewiring pattern, which is made of copper (Cu), is electrically connected to electrode pads of a semiconductor device (semiconductor element). The rewiring pattern is connected to conductive posts, which are made of copper (Cu). The semiconductor device is molded with a resin so that the molding resin has an upper surface on the same plane with upper surfaces of the conductive posts. Solder balls are formed on upper ends of the Cu posts, which are exposed from the molding resin.

The above-described process is carried out on a semiconductor wafer, which has a plurality of semiconductor devices. The semiconductor wafer is diced to make individual semiconductor apparatuses. The semiconductor devices are mounted on a circuit board or substrate.

An electrical test is carried out on the semiconductor apparatus mounted on the circuit board. At the same time, the solderability or wetting condition of the solder balls is inspected. Such a solderability or wetting inspection is important to know the mechanical strength of the apparatus, especially when the apparatus is used in a vehicle, in which case it is required to have high reliability. However, according to the above-described conventional semiconductor apparatus, the solder balls are arranged deep inside of the apparatus. As a result, it is difficult to visually recognize the solderability or wetting condition of the solder balls. The very ends of electrodes are easily applied with outside stress, so that solder balls for those electrodes must be connected reliably.

OBJECTS OF THE INVENTION

Accordingly, an object of the present invention is to provide a semiconductor apparatus in which the solderability or wetting condition can be visually and easily inspected.

Another object of the present invention is to provide a method for fabricating a semiconductor apparatus in which the solderability or wetting condition can be visually and easily inspected.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor apparatus includes a semiconductor device to be mounted on a circuit board; a plurality of conductive posts electrically connected to the semiconductor device; and a plurality of conductive bumps each provided on an outer end of each of the conductive posts, so that the plurality of conductive bump is soldered onto the circuit board when the semiconductor device is mounted on the circuit board. A distance between a peripheral edge of the semiconductor device and an outer edge of the conductive post is determined to be narrow so that a solderability or wetting condition of the conductive bumps can be visibly recognized easily. In the above-described semiconductor apparatus, preferably, the distance is in a range of 50 to 100 micrometers.

The semiconductor device may be provided with a plurality of electrode pads connected to the conductive posts, the electrode pads being arranged on a line extending at the center of the semiconductor device. In another case, each of the electrode pads may be arranged between two adjacent conductive posts. In still another case, each of the electrode pads is arranged directly under a corresponding conductive post.

According to a second aspect of the present invention, a semiconductor apparatus includes a semiconductor device to be mounted on a circuit board; a plurality of conductive posts electrically connected to the semiconductor device; a plurality of conductive bumps respectively provided on an outer end of each of the conductive posts, so that the plurality of conductive bumps each soldered onto the circuit board when the semiconductor device is mounted on the circuit board; and a molding resin which covers a surface of the semiconductor device. The molding resin is shaped to have a step along an entire peripheral edge of the semiconductor device, the step having upper and lower level portions.

Preferably, the difference in level between the upper portion and lower portion of the step is half the thickness of the molding resin. The difference in level between the upper portion and lower portion of the step may be in a range 40 to 60 micrometers.

According to a third aspect of the present invention, a semiconductor apparatus includes a semiconductor device to be mounted on a circuit board; a plurality of conductive posts electrically connected to the semiconductor device; a plurality of first conductive bumps respectively provided on an outer end of each of the conductive posts, so that the plurality of first conductive bumps are soldered onto the circuit board when the semiconductor device is mounted on the circuit board; a molding resin which covers a surface of the semiconductor device; and an insulating layer which is formed at portions corresponding to the conductive posts and at a peripheral portion of the semiconductor device. The molding resin is shaped to have a peripheral side surface that is on the identical plane with a peripheral side surface of the semiconductor device.

Preferably, the insulating layer is formed to have a width of 100 to 200 $\mu$m. The semiconductor apparatus may further includes a plurality of second conductive bumps each provided on the peripheral side surface of the conductive posts.

According to a fourth aspect of the present invention, a method for fabricating a semiconductor apparatus includes the steps of providing a semiconductor wafer on which a plurality of semiconductor devices are formed, each of the semiconductor device having electrode pads thereon; providing a plurality of conductive post connected to the electrode pads of the semiconductor devices; molding the semiconductor devices with a molding resin so that an upper surface of the molding resin is on the same plane with upper surfaces of the conductive posts; removing a part of the molding resin to be located at a peripheral edge so that the peripheral edge of the molding resin has a step, the step having upper and lower level portions; providing conductive bumps on outer ends of the conductive posts; and dicing the semiconductor wafer to form a plurality of individual semiconductor apparatuses.

According to a fifth aspect of the present invention, a method for fabricating a semiconductor apparatus includes the steps of: providing a semiconductor wafer on which a plurality of semiconductor devices are formed, each of the semiconductor device having electrode pads thereon; forming grooves at portions corresponding to dicing lines of the semiconductor wafer; forming an insulating layer on the wafer so that the grooves are filled with the insulating layer but a part of the electrode pad of the semiconductor devices is not covered with the insulating layer; forming a metal layer on the insulating layer and the part of the electrode pads, which is not covered with the insulating layer; forming a rewiring layer on the metal layer; providing a conductive post material that extend across each of the grooves; molding the semiconductor wafer with a molding resin so that an upper surface of the molding resin is on the same plane with upper surfaces of the conductive post material; providing a conductive bump material on the conductive post material across each groove; and dicing the semiconductor wafer at the grooves to form a plurality of individual semiconductor apparatuses.

Preferably, the method further includes the steps of: expanding the distance between two adjacent semiconductor devices after the dicing process; and reflowing the distanced semiconductor devices so as to form a conductive soldering bump on a peripheral side surface of each of the conductive posts.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
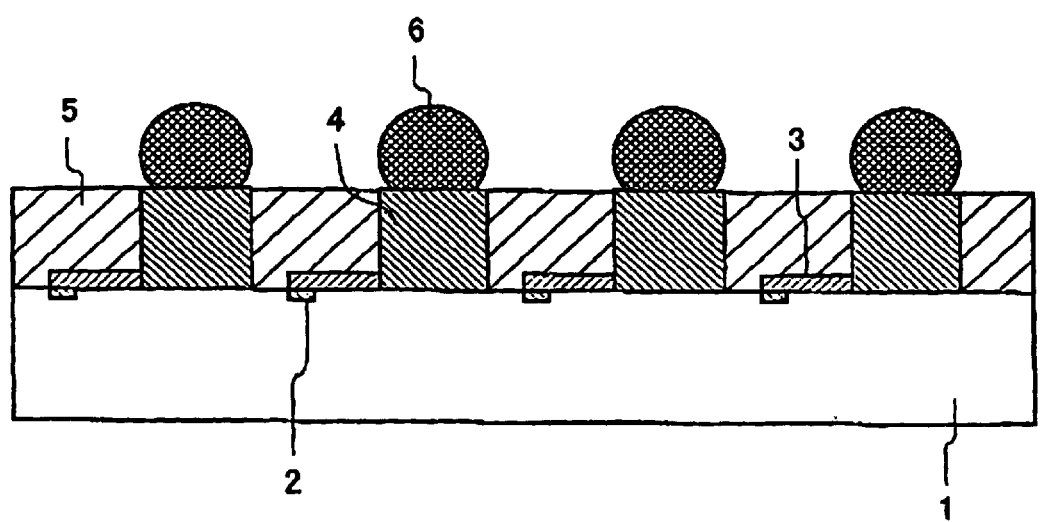
FIG. 1 is a cross-sectional view showing a part of a conventional semiconductor apparatus.
Figure 2:
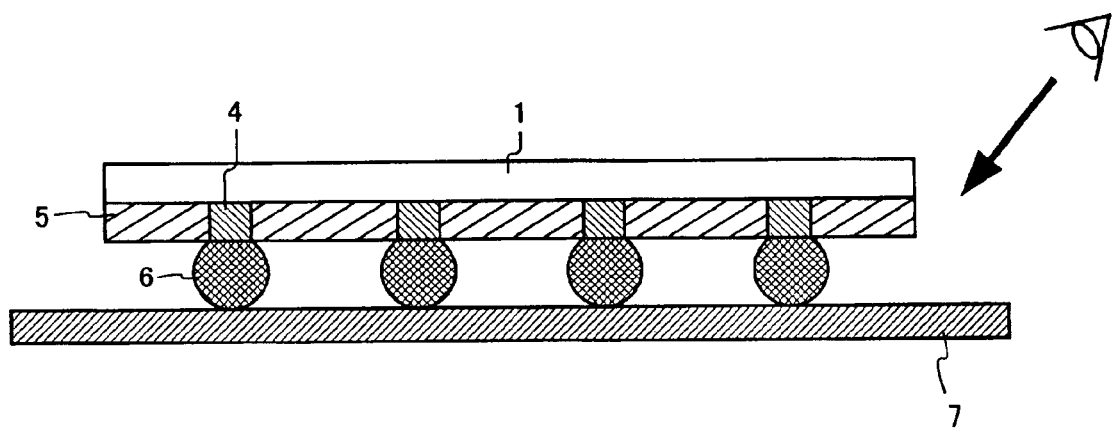
FIG. 2 is a cross-sectional side view showing the conventional semiconductor apparatus mounted on a circuit board.

For better understanding of the present invention, a conventional technology is first described in conjunction with FIGS. 1 and 2. FIG. 1 is a cross-sectional view showing a part of a conventional semiconductor apparatus. FIG. 2 is a cross-sectional side view showing the conventional semiconductor apparatus mounted on a circuit board. A rewiring pattern 3, which is made of copper (Cu), is electrically connected to electrode pads 2 of a semiconductor device (semiconductor element) 1. The rewiring pattern 3 is connected to conductive posts 4, which are made of copper (Cu). The semiconductor device 1 is molded with a resin 5 so that the molding resin 5 has an upper surface on the same plane with upper surfaces of the conductive posts 4. Solder balls 6 are formed on upper ends of the Cu posts 4, which are exposed from the molding resin 5.

The above-described process is carried out on a semiconductor wafer, which has a plurality of semiconductor devices. The semiconductor wafer is diced to make individual semiconductor apparatuses. The semiconductor devices 1 are mounted on a circuit board or substrate 7, as shown in FIG. 2.

An electrical test is carried out to the semiconductor apparatus mounted on the circuit board 7. At the same time, solderability or wetting condition of the solder balls 6 is inspected. Such a solderability or wetting inspection is important to know mechanical strength of the apparatus, especially used in vehicles which are required with high reliability. However, according to the above-described conventional semiconductor apparatus, the solder balls 6 are arranged at deep inside of the apparatus. As a result, it is difficult to visually recognize the solderability or wetting condition of the solder balls 6. The very ends of electrodes are easily applied with outside stress, so that solder balls for those electrodes must be connected reliably.

First Preferred Embodiment

Figure 3:
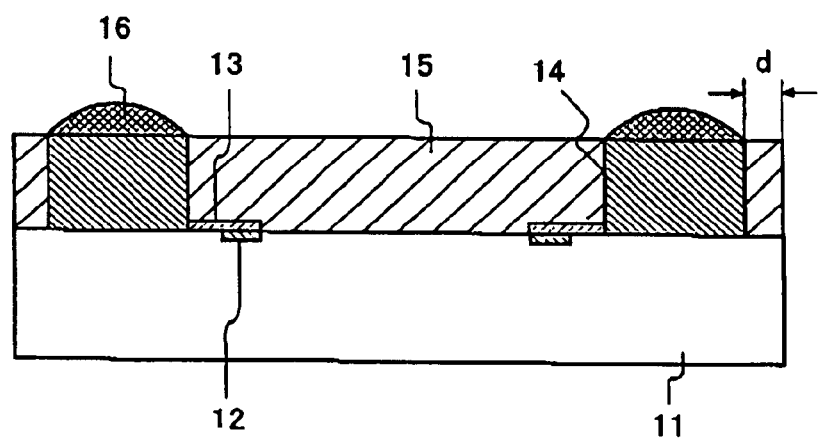
FIG. 3 is a cross-sectional view showing a part of a semiconductor apparatus according to a first preferred embodiment of the present invention.

FIG. 3 is a cross-sectional view showing a part of a resin-molded type of semiconductor apparatus according to a first preferred embodiment of the present invention. The semiconductor apparatus includes a semiconductor device (element) 11; a plurality of electrode pads 12; a rewiring pattern 13; a plurality of conductive posts 14, connected through the rewiring pattern 13 to the electrode pads 13; a molding resin 15 shaped to have an upper surface on the same plane with upper surfaces of the conductive posts; and solder balls 16 provided on upper ends of the conductive posts 14.

The electrode pads 12 are connecting electrodes, made of aluminum (Al), for the semiconductor devices 11. The rewiring pattern 13, connecting the electrode pads 12 and the posts 14, is made of copper (Cu). The posts 14 are made of copper (Cu) to be pillar shaped.

Figure 4:
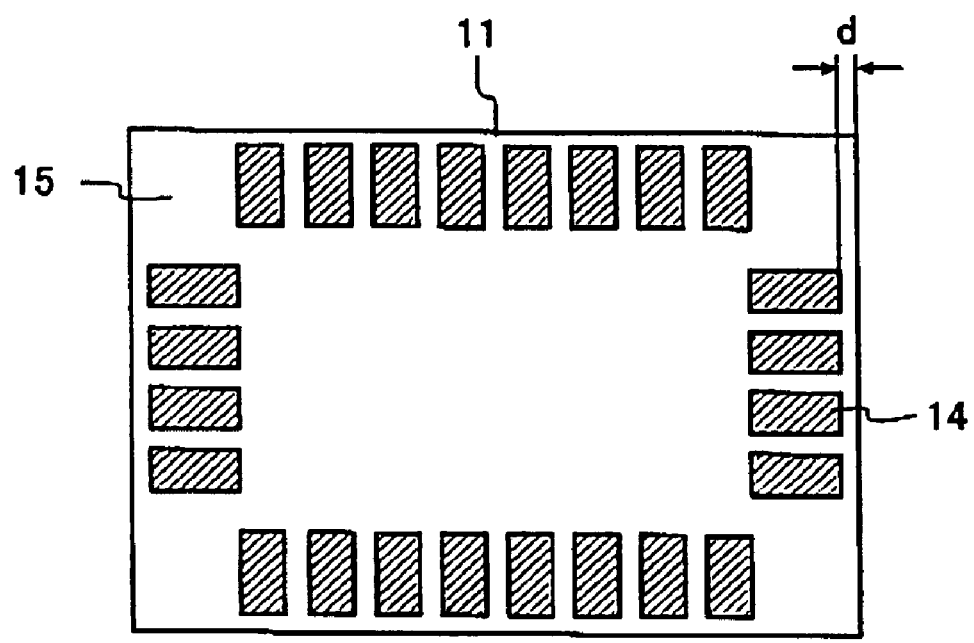
FIG. 4 is a plan view showing an arrangement of conductive posts of the semiconductor apparatus, shown in FIG. 3.

FIG. 4 is a plan view showing an arrangement of conductive posts 14, in which the rewiring pattern 13, solder balls 16 and electrode pads 12 are abbreviated for easy understanding. On each side of the semiconductor apparatus, the posts 14 are arranged on a straight line extending along the side of the semiconductor apparatus.

Now referring again to FIG. 3, a distance "d" between a peripheral edge of the semiconductor device 11 and an outer edge of the post 14 is determined to be narrow so that a solderability or wetting condition of the solder balls 16 can be visibly recognized easily. The distance "d" is less than a height of the post 14 as clearly shown in the FIGS. 3–8, and is preferably determined to be in a range between 50 and 100 micrometers ($\mu$m).

Figure 5:
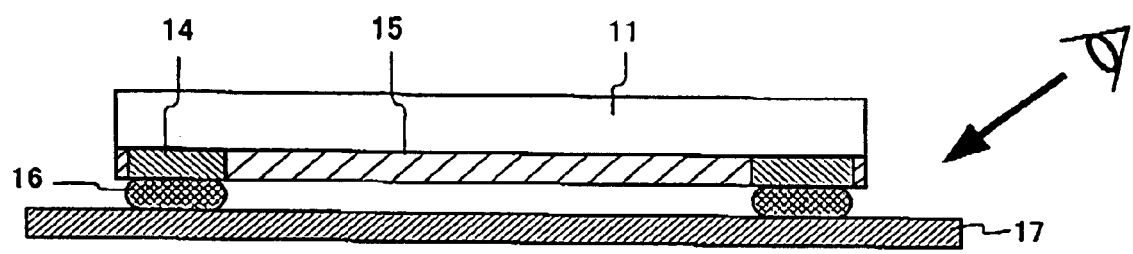
FIG. 5 is a cross-sectional side view showing the semiconductor apparatus, shown in FIG. 3, mounted on a circuit board.

FIG. 5 is a cross-sectional side view showing the semiconductor apparatus, shown in FIG. 3, mounted on a circuit board 17. The semiconductor device 11 is mounted on the circuit board 17 with the solder balls 16. The solderability or wetting condition of the solder balls 16 can be visibly recognized easily.

As described above, according to the first preferred embodiment of the present invention, distance "d" between the peripheral edge of the semiconductor device 11 (peripheral edge of the resin 15) and the outer edge of the conductive post 14 is determined to be narrow. As a result, a solderability or wetting condition of the solder balls 16 can be visibly recognized easily.

Figure 6:
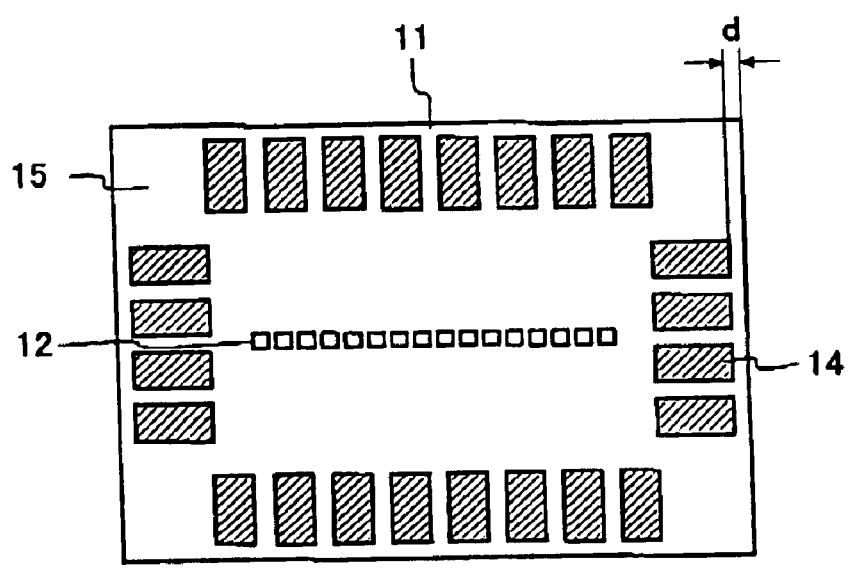
FIG. 6 is a plan view showing an arrangement of electrode pads of the semiconductor apparatus, shown in FIG. 3.

FIG. 6 is a plan view showing an arrangement of electrode pads 14 of the semiconductor apparatus, shown in FIG. 3, in which the rewiring pattern 13 and solder balls 16 are abbreviated for easy understanding. On each side of the semiconductor apparatus, the posts 14 are arranged on a straight line extending along the side of the semiconductor apparatus. The electrode pads 12 are arranged on a line extending in the center region of the semiconductor device and are connected to the conductive posts 14 via the rewiring pattern 13.

Figure 7:
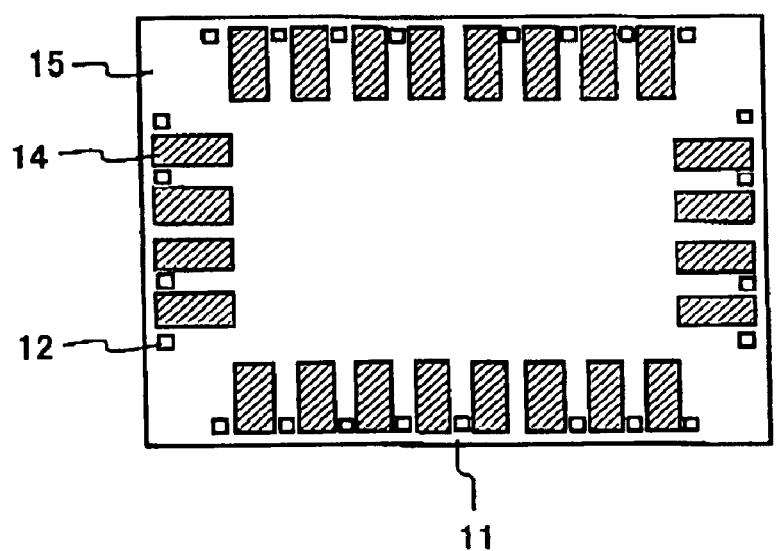
FIG. 7 is a plan view showing another arrangement of electrode pads of the semiconductor apparatus, shown in FIG. 3.

FIG. 7 is a plan view showing another arrangement of electrode pads 12 of the semiconductor apparatus, shown in FIG. 3, in which the rewiring pattern 13 and solder balls 16 are abbreviated for easy understanding. Each of the electrode pads 12 is arranged between two adjacent conductive posts 14.

Figure 8:
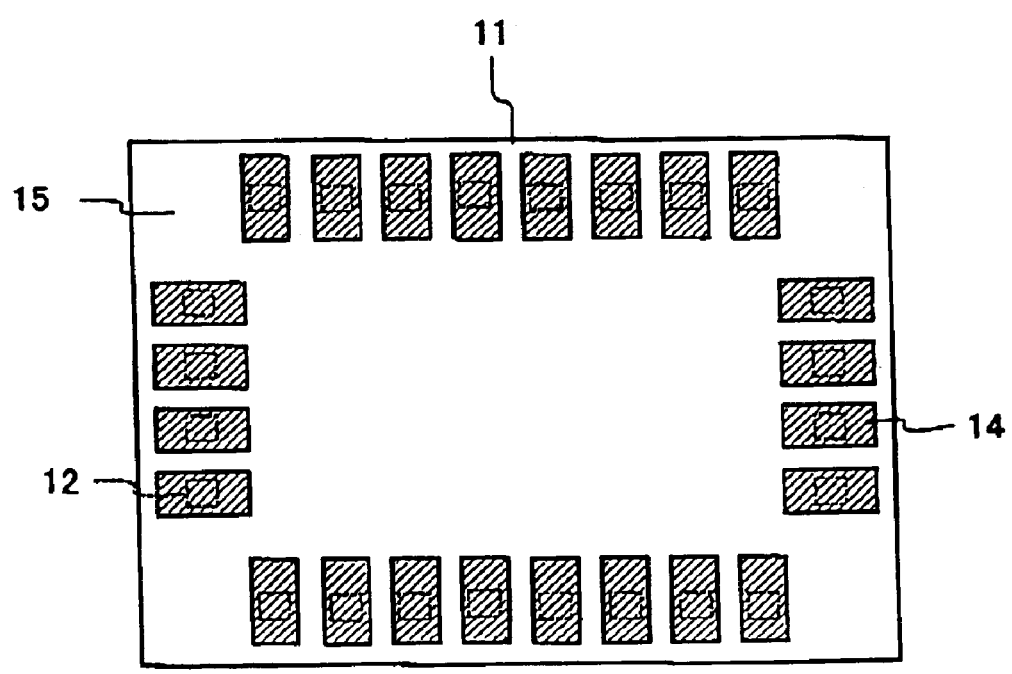
FIG. 8 is a plan view showing another arrangement of electrode pads of the semiconductor apparatus, shown in FIG. 3.

FIG. 8 is a plan view showing another arrangement of electrode pads of the semiconductor apparatus, shown in FIG. 3, in which the rewiring pattern 13 and solder balls 16 are abbreviated for easy understanding. Each of the electrode pads 12 is arranged directly under a corresponding conductive post 14.

According to the arrangements of the electrode pads 12 shown in FIGS. 6–8, it becomes easy to arrange the conductive posts 14 extending along the side lines (edges) of the semiconductor apparatus. This kind of feature is useful when the semiconductor apparatus is provided with a relatively small number of electrode pads thereon.

Second Preferred Embodiment

Figure 9:
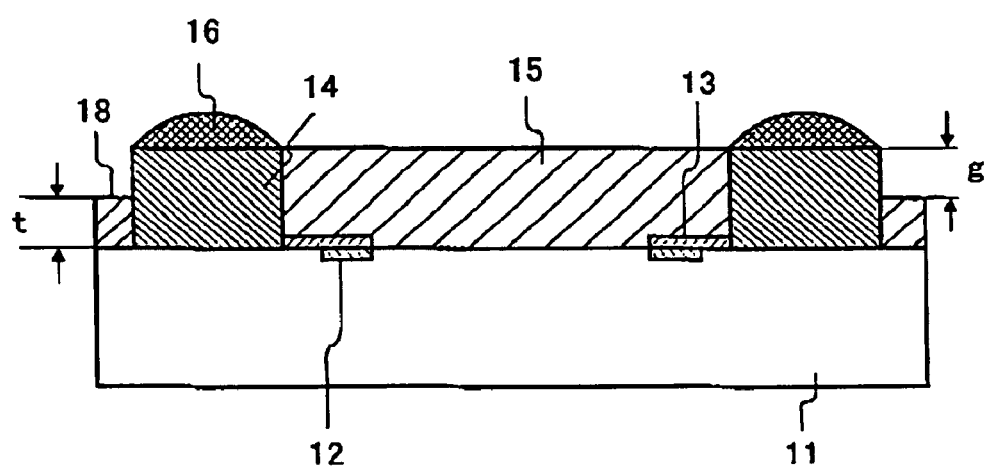
FIG. 9 is a cross-sectional view showing a part of a semiconductor apparatus according to a second preferred embodiment of the present invention.

FIG. 9 is a cross-sectional view showing a part of a semiconductor apparatus according to a second preferred embodiment of the present invention. In this embodiment, the same or corresponding elements to those in the above described embodiments are represented by the same reference numerals. The semiconductor apparatus includes a semiconductor device (element) 11; a plurality of electrode pads 12; a rewiring pattern 13; a plurality of conductive posts 14, connected through the rewiring pattern 13 to the electrode pads 13; a molding resin 15 shaped to have an upper surface on the same plane with upper surfaces of the conductive posts; and solder balls 16 provided on upper ends of the conductive posts 14.

The electrode pads 12 are connecting electrodes, made of aluminum (Al), for the semiconductor devices 11. The rewiring pattern 13, connecting the electrode pads 12 and the posts 14, is made of copper (Cu). The posts 14 are made of copper (Cu) to be pillar shaped.

Figure 10:
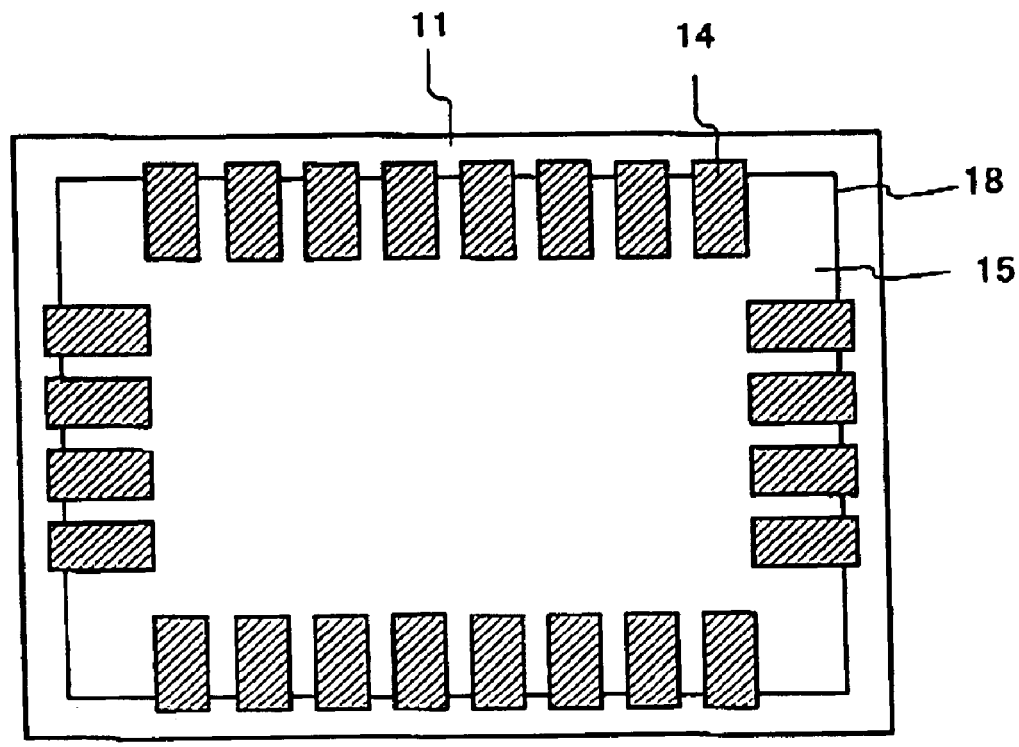
FIG. 10 is a plan view showing the semiconductor apparatus, shown in FIG. 9.
Figure 11:
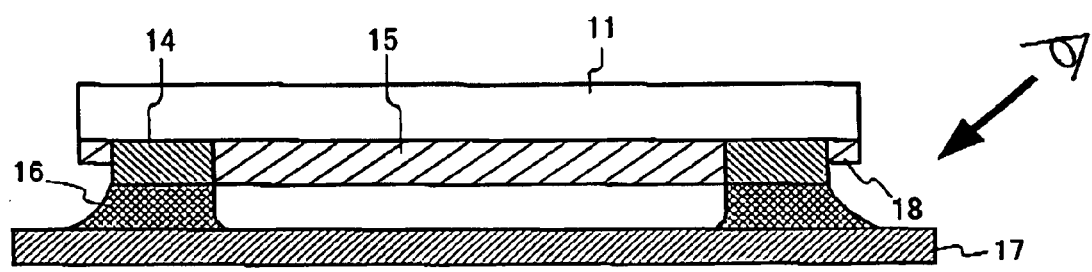
FIG. 11 is a cross-sectional side view showing the semiconductor apparatus, shown in FIG. 9, mounted on a circuit board.

FIG. 10 is a plan view showing the semiconductor apparatus, shown in FIG. 9, in which the electrode pads 12, rewiring pattern 13 and solder balls 16 are abbreviated for easy understanding. FIG. 11 is a cross-sectional side view showing the semiconductor apparatus, shown in FIG. 9, mounted on a circuit board 17.

According to the second preferred embodiment, the molding resin 15 is shaped to have a step (level-difference portion) 18 at a peripheral edge of the semiconductor device entirely. The step 18 includes upper and lower level portions. Preferably, the difference "g" in: level between the upper portion and lower portion of the step 18 is half of a thickness "t" of the molding resin 15. More precisely, the difference "g" may be determined to be in a range between 40 to 60 micrometers ($\mu$m).

As described above, according to the second preferred embodiment, the molding resin 15 is provided with the step 18, so that the solder balls 16 are melted when the semiconductor apparatus is mounted on the circuit board 17, as shown in FIG. 11. As a result, a solderability or wetting condition of the solder balls 16 can be visibly recognized easily.

Figure 12A:
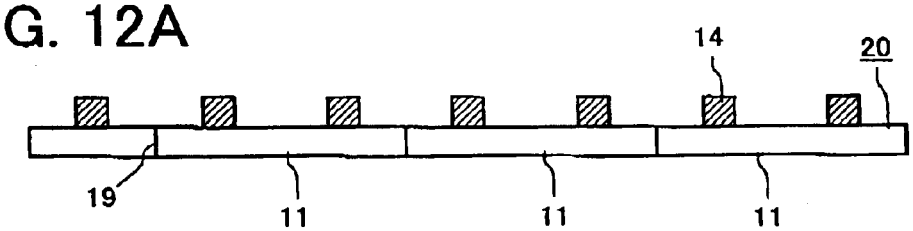
FIGS. 12A to 12F are cross-sectional views showing fabrication steps of the semiconductor apparatus, shown in FIG. 9.

FIGS. 12A to 12F are cross-sectional views showing fabrication steps of the semiconductor apparatus, shown in FIG. 9. In fabrication, a wafer 10 on which a plurality of semiconductor device 11 is formed is provided. Next, as shown in FIG. 12A, conductive posts 14 are formed on the semiconductor devices 11 so that the posts 14 are connected through a rewiring pattern 13 (not shown) to electrode pads 12 (not shown) of the semiconductor devices 11. The posts 14 are formed adjacent a peripheral edge of the semiconductor device 11.

Figure 12B:
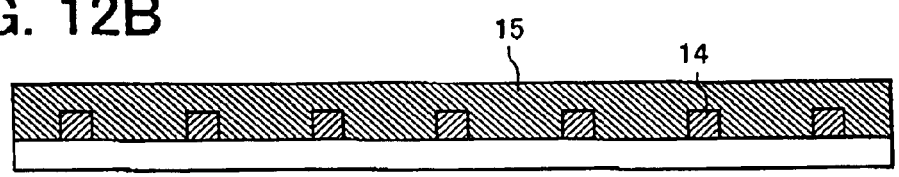

Next, as shown in FIG. 12B, the semiconductor devices 11 are molded with a molding resin 15. The molding resin 15 is formed to have an upper surface higher than the conductive posts 14.

Figure 12C:
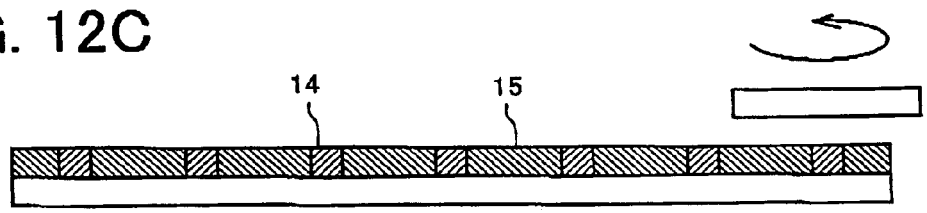

Subsequently, as shown in FIG. 12C, the upper surface of the molding resin 15 is polished or planed with a polishing device 21 until the upper surfaces (upper ends) of the posts 14 are exposed.

Figure 12D:
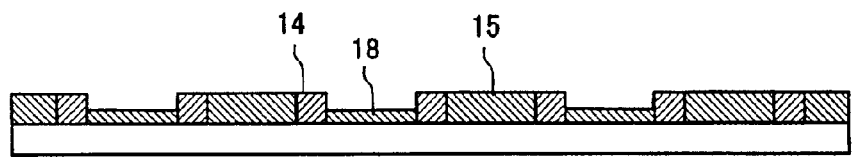

Referring to FIG. 12D, next, the molding resin 15 is partly removed to form lower level regions that are to be peripheral portions of the molding resin 15 when individual semiconductor apparatuses are formed by a dicing process. The lower level regions have a thickness of 40 to 60 $\mu$m. The lower level regions are located between two adjacent posts 14. The peripheral portions of the molding resin 15 correspond to the step 18. To remove the molding resin 15 partly or selectively, the molding resin 15 may be burned out by YAG (Yttrium-Aluminum-Garnet) laser having a 1 $\mu$m wavelength.

Figure 12E:
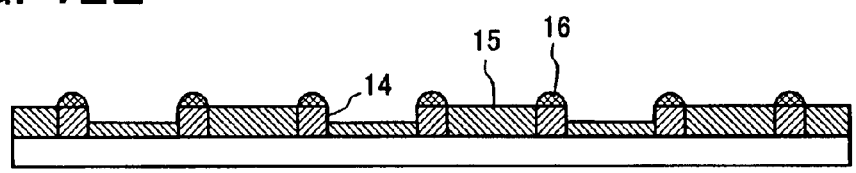

Next, as shown in FIG. 12E, solder balls 16 are provided on the exposed upper ends of the posts 14 to form terminals.

Figure 12F:
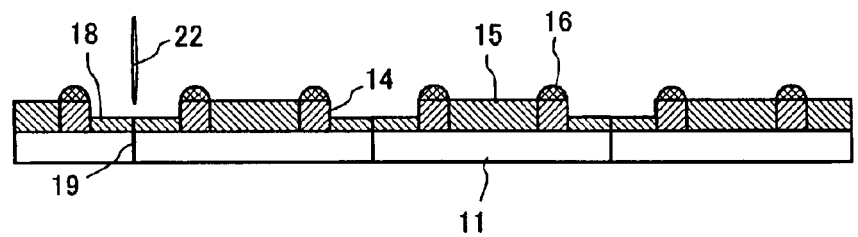

Subsequently, as shown in FIG. 12F, the wafer 20 is diced along dicing lines 19, located at the center of each lower level portions for the steps 18, using a cutter blade 22. As a result, individual semiconductor apparatuses are formed, as shown in FIG. 11.

As described above, when the molding resin 15 is partly removed using laser or the like, the molding resin 15 can be shaped to have the step 18.

Third Preferred Embodiment

Figure 13:
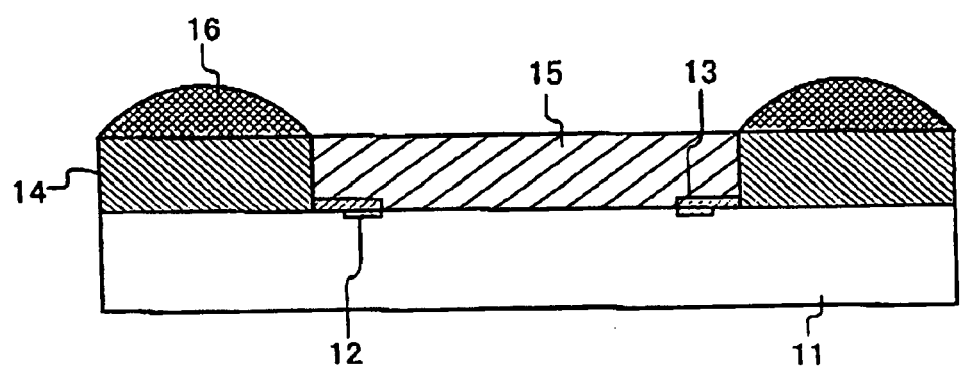
FIG. 13 is a cross-sectional view showing a part of a semiconductor apparatus according to a third preferred embodiment of the present invention.
Figure 14:
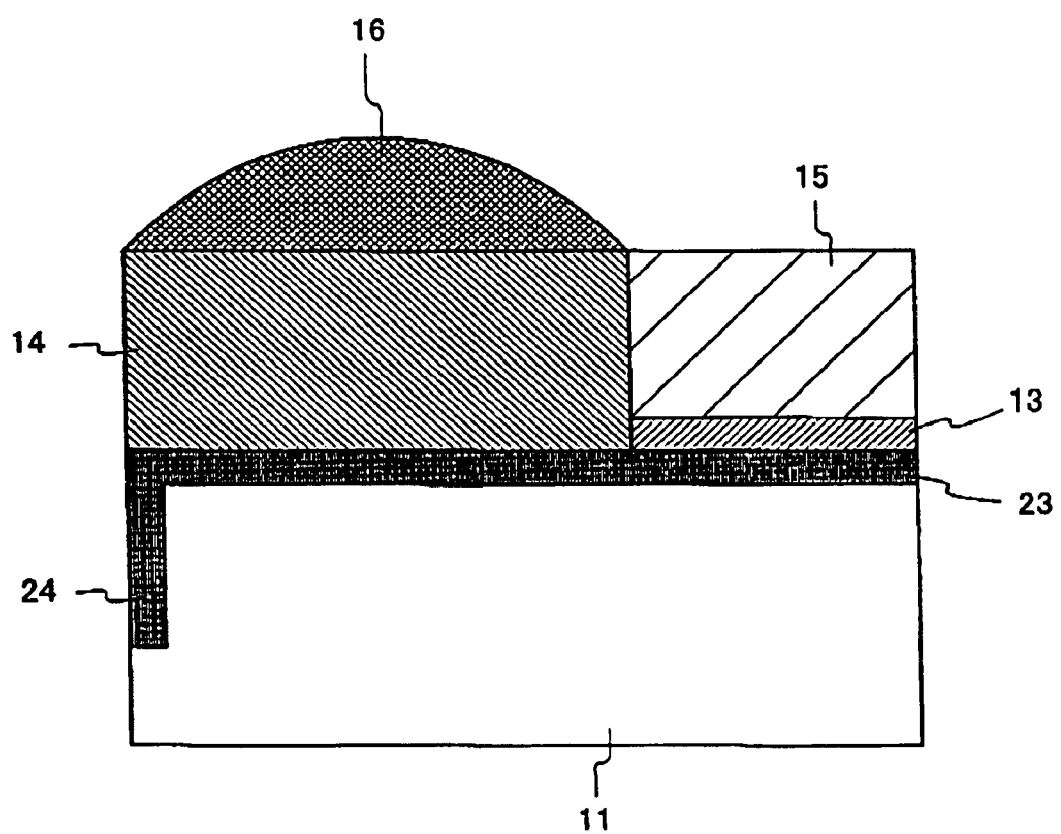
FIG. 14 is a cross-sectional view showing an enlarged part of the semiconductor apparatus, shown in FIG. 13.

FIG. 13 is a cross-sectional view showing a part of a semiconductor apparatus according to a third preferred embodiment of the present invention. FIG. 14 is a cross-sectional view showing an enlarged part of the semiconductor apparatus, shown in FIG. 13. In this embodiment, the same or corresponding elements to those in the above described embodiments are represented by the same reference numerals.

The semiconductor apparatus includes a semiconductor device (element) 11; a plurality of electrode pads 12; a rewiring pattern 13; a plurality of conductive posts 14, connected through the rewiring pattern 13 to the electrode pads 13; a molding resin 15 shaped to have an upper surface on the same plane with upper surfaces of the conductive posts; and solder balls 16 provided on upper ends of the conductive posts 14.

The electrode pads 12 are connecting electrodes, made of aluminum (Al), for the semiconductor devices 11. The rewiring pattern 13, connecting the electrode pads 12 and the posts 14, is made of copper (Cu). The posts 14 are made of copper (Cu) to be pillar shaped. The molding resin 15 is shaped to have a peripheral side surface that is on the identical plane with a peripheral side surface of the semiconductor device 11.

Figure 15:
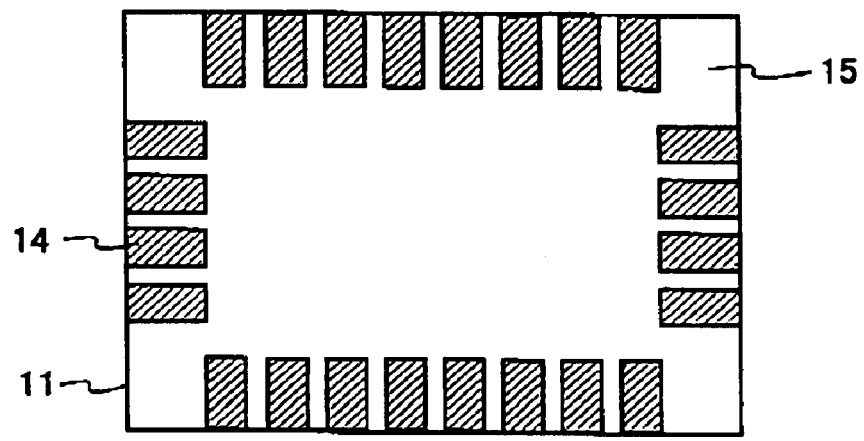
FIG. 15 is a plan view showing an arrangement of conductive posts of the semiconductor apparatus, shown in FIG. 13.
Figure 16:
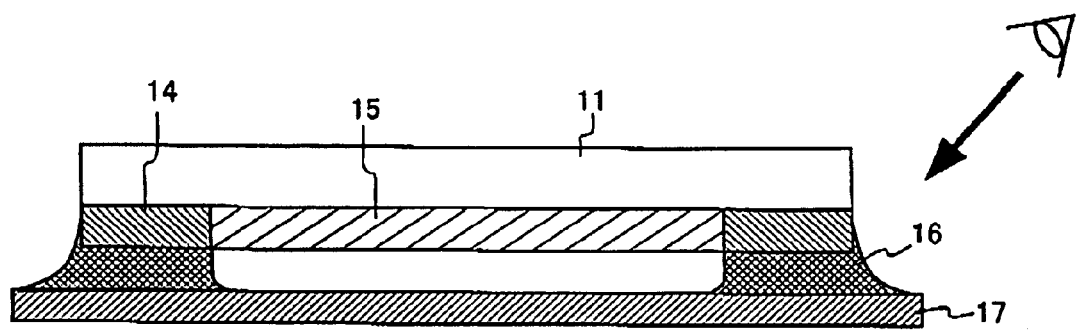
FIG. 16 is a cross-sectional side view showing the semiconductor apparatus, shown in FIG. 13, mounted on a circuit board.

FIG. 15 is a plan view showing an arrangement of conductive posts of the semiconductor apparatus, shown in FIG. 13, in which the electrode pads 12, rewiring pattern 13 and solder balls 16 are abbreviated for easy understanding. FIG. 16 is a cross-sectional side view showing the semiconductor apparatus, shown in FIG. 13, mounted on a circuit board.

The semiconductor apparatus further includes insulating layers 23 and 24. The insulating layer 23 is formed on an upper surface of the semiconductor device 11. The insulating layer 24 is formed to surround the periphery of the semiconductor device 11 entirely. The insulating layer 24 is formed to be belt shape having a width of 100 to 200 $\mu$m at post side regions. The insulating layer 24 may be formed to surround the end face of the semiconductor device 11 entirely.

According to the third preferred embodiment, as shown in FIG. 12, the solder balls 16 are melted when the semiconductor apparatus is mounted on the circuit board 17; and the melted solder extends to the end face of the conductive posts 14. Therefore, solder strength between the semiconductor apparatus and circuit board 17 becomes higher. Since the semiconductor device 11 is covered at the end face with the insulating layer 24, no short circuit is made even if the solder extends to the side surface of the conductive posts 14.

As described above, according to the third preferred embodiment, the molding resin 15 is formed to have a side surface (end face) on the same plane with a peripheral side surface (end face) of the semiconductor device 11, so that a solderability or wetting condition of the solder balls 16 can be visibly recognized easily. Further, the semiconductor device 11 is covered at its peripheral surface (end face) with the insulating layer 24, whereby the occurrence of short circuits can be prevented.

FIGS. 17A to 17J are cross-sectional views showing fabrication steps of the semiconductor apparatus, shown in FIG. 13. Each of FIGS. 17A to 17F shows only a part of wafer. In fabrication, first, a wafer 20, on which a plurality of semiconductor device 11 is formed, is provided.

Figure 17A:
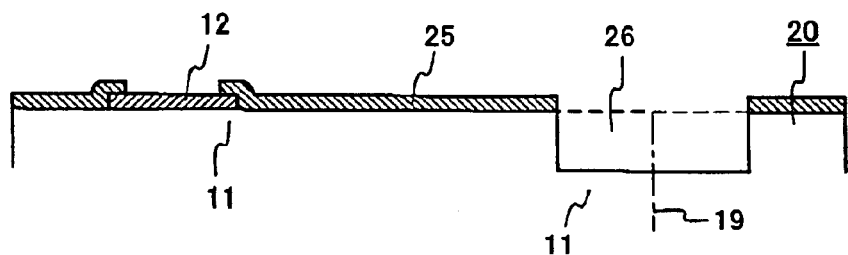
FIGS. 17A to 17J are cross-sectional views showing fabrication steps of the semiconductor apparatus, shown in FIG. 13.

Next, as shown in FIG. 17A, electrode pads 12 and an oxide layer 25 are formed on a substrate. Then grooves 26 are formed on dicing lines of the wafer 20 to have a depth of 100 to 200 $\mu$m.

Figure 17B:
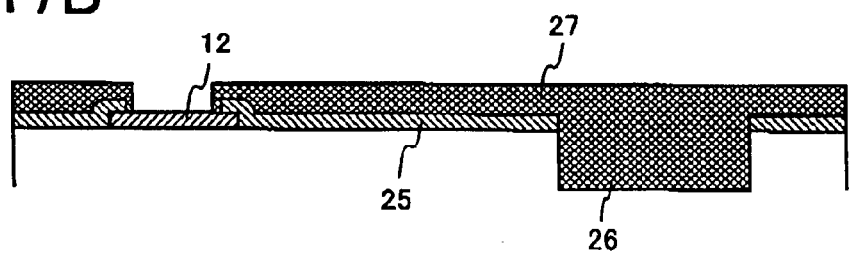

In a process shown in FIG. 17B, an insulating layer 27 is formed on the wafer 20 so that the grooves 26 are filled with the insulating layer 27 but a part of the electrode pad 12 of the semiconductor devices is not covered with the insulating layer 27. The insulating layer 27 may be of polyimide resin. The insulating layer 27 formed on the oxide layer 25 to have a thickness of several $\mu$m is later functioning as the insulating layer 23, shown in FIG. 14. On the other hand, the insulating layer 27 filled in the grooves 26 is later functioning as the insulating layer 27, shown in FIG. 14.

Figure 17C:
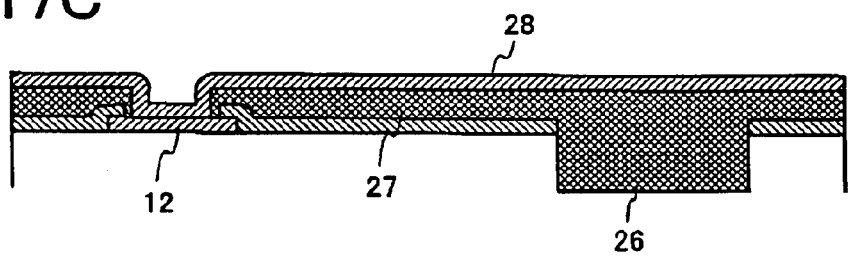
Figure 17D:
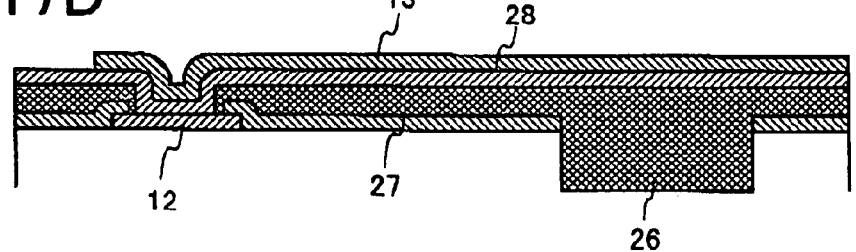

Next, as shown in FIG. 17C, a metal layer 28 is formed over the wafer 20. In other words, the insulating layer 27 and the exposed electrode pads 12 are covered with the metal layer 28. Subsequently, as shown in FIG. 17D, a rewiring layer 13 is formed on selective areas of the metal layer 28. The selective areas are used for electrical connection.

Figure 17E:
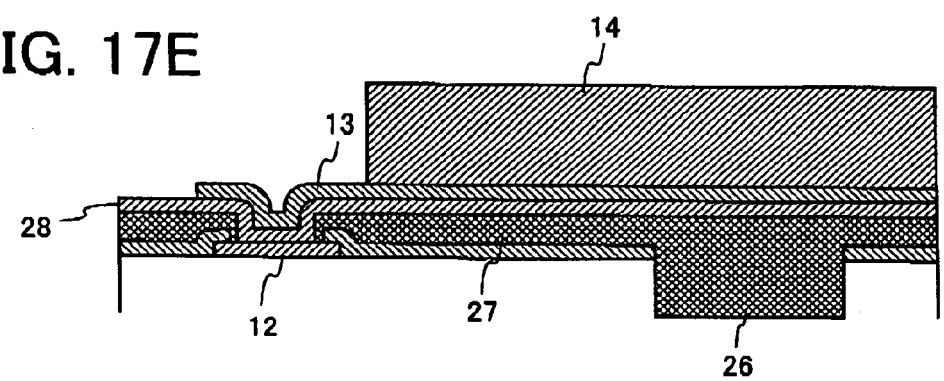
Figure 17F:
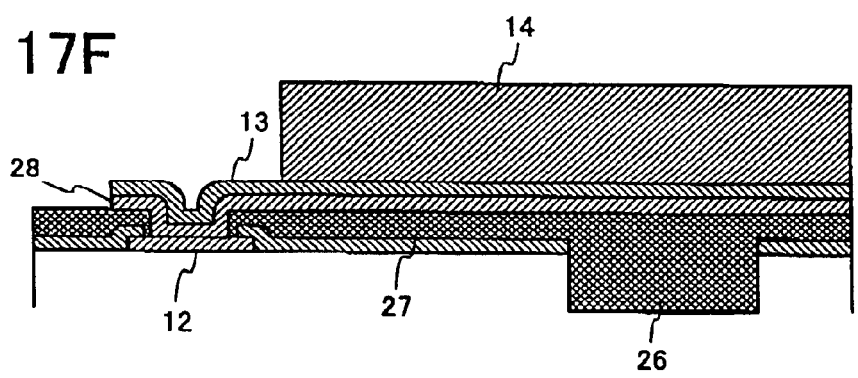
Figure 17G:
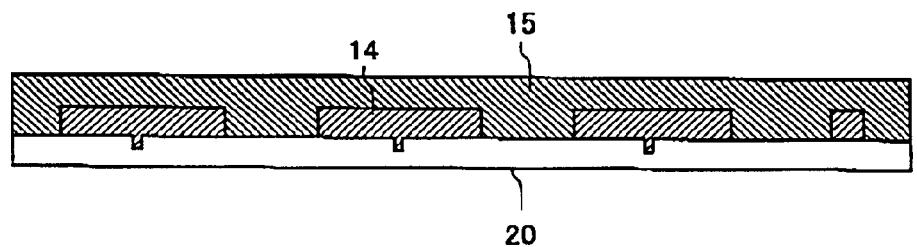

Referring to FIG. 17E, a conductive post material 14 is formed on the rewiring layer 13 to extend across the groove 26. The post material 14 is used for two individual conductive posts after the wafer 20 is diced into individual semiconductor apparatuses. Next, as shown in FIG. 17F, unnecessary parts of the metal layer 28 is removed. As shown in FIG. 17G, after that, the semiconductor wafer 20 is molded with a molding resin 15 so that an upper surface of the molding resin 15 is on the same plane with upper surfaces of the conductive post material 14.

Figure 17H:
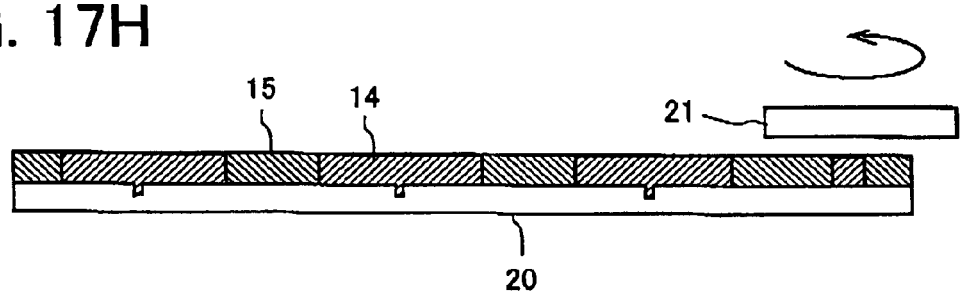
Figure 17I:
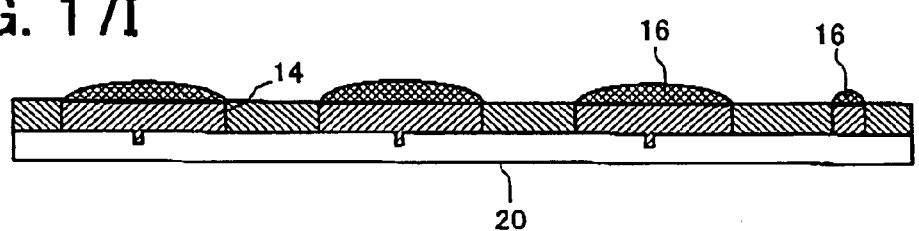
Figure 17J:
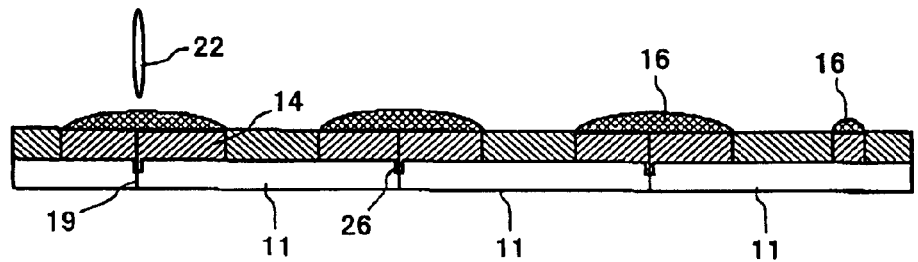

Subsequently, as shown in FIG. 17H, the molding resin 15 is polished with a polishing device 21 until the post material 14 is exposed. Next, as shown in FIG. 17I, solder balls (conductive bumps) 16 are formed on upper ends of the conductive posts 14. Then, as shown in FIG. 17J, the semiconductor wafer 20 is diced along the dicing lines 19 to form a plurality of individual semiconductor apparatuses using a cutter blade 22.

As described above, according to the third preferred embodiment of the present invention, the insulating layer 27 is filled in the grooves so that the insulating layer 23 is formed on the semiconductor devices 11 and at the same time the insulating layer 24 is formed on the peripheral side surface of the semiconductor devices 11 so as to surround this peripheral side surface entirely.

Fourth Preferred Embodiment

Figure 18:
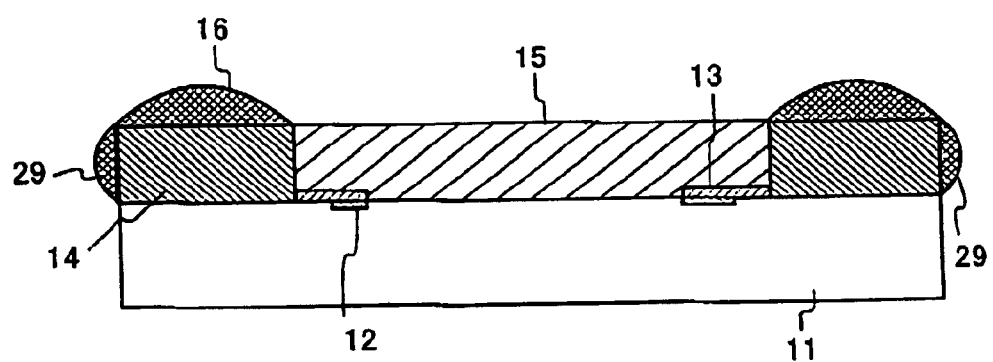
FIG. 18 is a cross-sectional view showing a part of a semiconductor apparatus according to a fourth preferred embodiment of the present invention.
Figure 19:
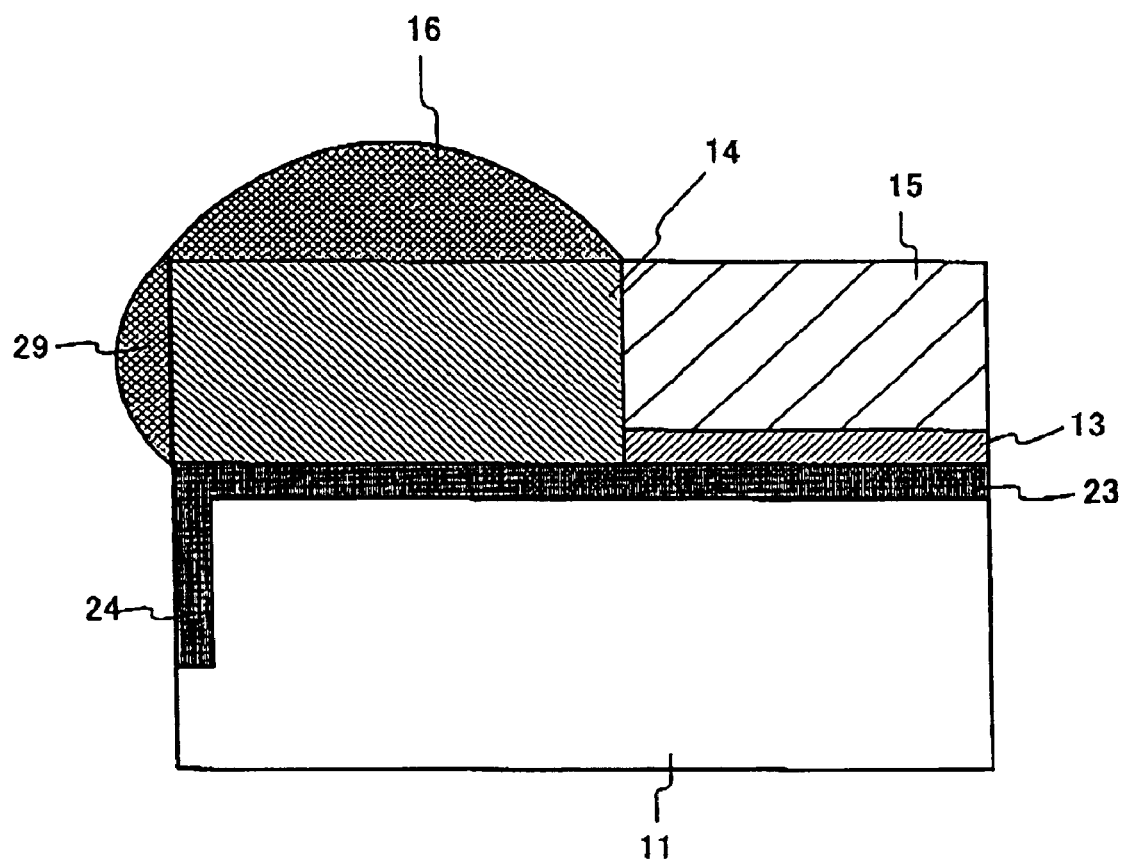
FIG. 19 is a cross-sectional view showing an enlarged part of the semiconductor apparatus, shown in FIG. 18.

FIG. 18 is a cross-sectional view showing a part of a semiconductor apparatus according to a fourth preferred embodiment of the present invention. FIG. 19 is a cross-sectional view showing an enlarged part of the semiconductor apparatus, shown in FIG. 18. In this embodiment, the same or corresponding elements to those in the above described embodiments are represented by the same reference numerals.

The semiconductor apparatus includes a semiconductor device (element) 11; a plurality of electrode pads 12; a rewiring pattern 13; a plurality of conductive posts 14, connected through the rewiring pattern 13 to the electrode pads 13; a molding resin 15 shaped to have an upper surface on the same plane with upper surfaces of the conductive posts; solder balls 16 provided on upper ends of the conductive posts 14; and solder bumps 29 provided on side surfaces of the conductive posts 14.

The electrode pads 12 are connecting electrodes, made of aluminum (Al, for the semiconductor devices 11. The rewiring pattern 13, connecting the electrode pads 12 and the posts 14, is made of copper (Cu). The posts 14 are made of copper (Cu) to be pillar shaped. The molding resin 15 is shaped to have a peripheral side surface that is on the identical plane with a peripheral side surface of the semiconductor device 11.

According to the fourth preferred embodiment, the solder bumps 29 are provide on the side surfaces of the conductive posts 14, so that a better solderability or wetting condition can be obtained when: the semiconductor apparatus is mounted on a circuit board. As a result, mechanical strength of soldered portions is improved. Further in the same manner as the third preferred embodiment, occurrences of short circuits are well prevented.

Namely, according to the fourth preferred embodiment, the solder bumps 29 are provide on the side surfaces of the conductive posts 14, so that mechanical strength of soldered portions is improved as compared to the third preferred embodiment.

Figure 20A:
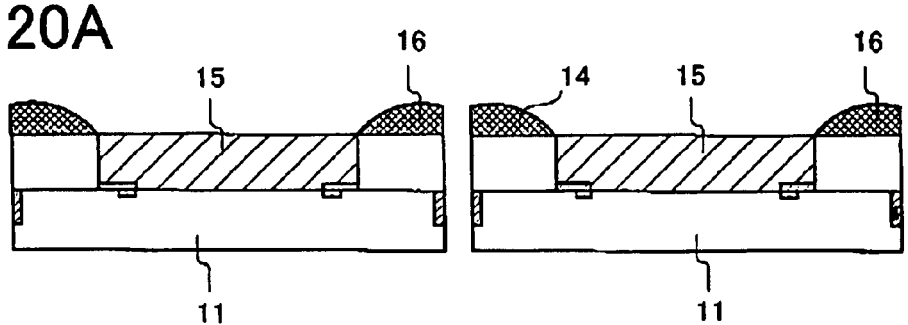
FIGS. 20A to 20C are cross-sectional views showing fabrication steps of the semiconductor apparatus, shown in FIG. 18.
Figure 20B:
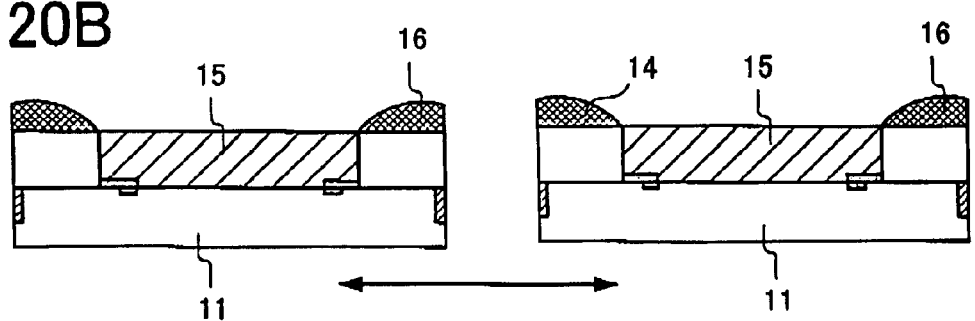
Figure 20C:
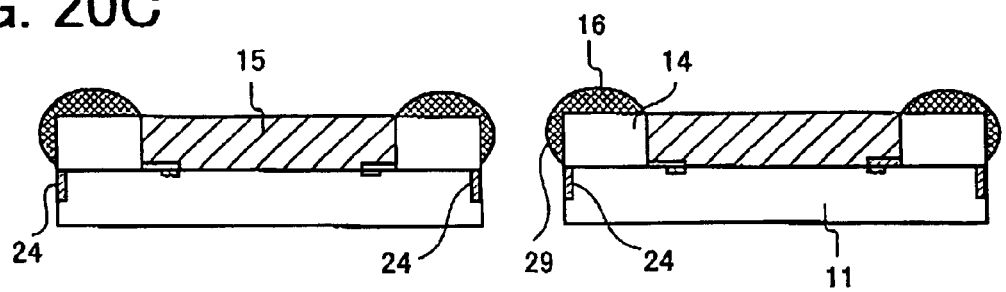

FIGS. 20A to 20C are cross-sectional views showing fabrication steps of the semiconductor apparatus, shown in FIG. 18. Semiconductor apparatuses, shown in FIG. 20A, are formed by dicing the semiconductor wafer 20, shown in FIG. 17J. That is, FIG. 20A follows FIG. 17J.

Now referring to FIG. 20B, the distances between two adjacent semiconductor apparatus (devices) 11 are expanded. Since individual semiconductor apparatus are usually mounted on a tape, the tape is expanded to widen the distance between two adjacent semiconductor apparatus (devices) 11. Next, as shown in FIG. 20C, thus distanced semiconductor devices are reflowed, for example at 230° C. As a result, the solder balls 16 on the posts 14 are melted and a solder bump 29 is formed on a peripheral side surface of each of the conductive posts 14.

Each of the solder balls 16 is originally shaped to be half of a hemisphere, as shown in FIG. 20B. After the reflow process, each of the solder balls 16 is shaped to be hemispheric on the upper end of the post 14, as shown in FIG. 20C. In the situation of FIG. 20B, the solder balls 16 have enough solder; and therefore, lack of solder does not happen in the situation of FIG. 20C.

As described above, the insulating layer 24, formed on the peripheral side surface of the semiconductor devices 11 entirely, is based on the insulating layer 27 filled in the grooves 26.

According to the fourth preferred embodiment, the solder bumps 29 can be easily formed on the side surfaces of the conductive posts 14 by a reflow process.

In the above described embodiments, although solder is used as a material for soldering, other kinds of material, such as zinc alloy and leadless tin alloy, can be used instead.

What is claimed is:

1. A semiconductor device comprising:
    a semiconductor element having a main surface, peripheral device edges bounding the main surface and a side surface extending from said peripheral edges, said semiconductor element having a plurality of electrodes formed thereon;
    a plurality of conductive posts each of which is electrically connected to a corresponding one of the plurality of electrodes formed on the semiconductor element, said conductive posts having outer edges;
    a resin covering over said main surface of the semiconductor element for sealing said main surface of the semiconductor element, said resin leaving said side surface of the semiconductor element exposed; and
    a plurality of conductive bumps respectively positioned on an outer end of each of the conductive posts, wherein the outer edges of said conductive posts are separated from said peripheral edges by a distance narrower than the height of the conductive posts.

2. A semiconductor device according to claim 1, wherein the distance is in a range between 50 and 100 micrometers.

3. A semiconductor device according to claim 1, wherein the electrodes are arranged on a line extending in a center portion of the semiconductor element.

4. A semiconductor device according to claim 1, wherein each of the electrodes is arranged between two adjacent conductive posts.

5. A semiconductor device according to claim 1, wherein each of the electrodes is arranged directly under a corresponding conductive post.

6. A semiconductor device according to claim 1, wherein the conductive bumps are of solder.

7. A semiconductor device comprising:
    a semiconductor element having a main surface, peripheral edges bounding the main surface and a side surface extending from said peripheral edges, said semiconductor element having a plurality of electrodes formed thereon;
    a plurality of conductive posts each of which is electrically connected to a corresponding one of the plurality of electrodes formed on the semiconductor element, said posts having outer ends and peripheral surfaces extending from said main surface of the semiconductor element to said outer ends of the conductive posts, said peripheral surfaces having inner end portions extending from said main surface of the semiconductor element, and outer end portions extending from said inner end portions to said outer ends of the conductive posts;
    a plurality of conductive bumps respectively positioned on said outer ends of the conductive posts; and
    a molding resin covering said main surface of the semiconductor element, wherein said molding resin includes a step portion along the entirety of a peripheral portion of said main surface of the semiconductor element, wherein the step portion is formed such that said inner end portions of the conductive posts are covered by said molding resin, and said outer end portions of the conductive posts and said side surface of the semiconductor device are exposed.

8. A semiconductor device according to claim 7, wherein the difference in level between the upper portion and lower portion of the step portion is half of a thickness of the mold resin.

9. A semiconductor device according to claim 7, wherein the difference in level between the upper portion and lower portion of the step portion is in a range between 40 and 60 micrometers.

10. A semiconductor device according to claim 7, wherein the conductive bumps are of solder.

* * * * *